US011631568B2

(12) United States Patent
Shirasaki et al.

(10) Patent No.: US 11,631,568 B2
(45) Date of Patent: Apr. 18, 2023

(54) DEVICE DEFECT DETECTION METHOD USING A CHARGED PARTICLE BEAM

(71) Applicant: Hitachi High-Tech Corporation, Tokyo (JP)

(72) Inventors: Yasuhiro Shirasaki, Tokyo (JP); Natsuki Tsuno, Tokyo (JP); Minami Shouji, Tokyo (JP); Yohei Nakamura, Tokyo (JP); Muneyuki Fukuda, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/554,216

(22) Filed: Dec. 17, 2021

(65) Prior Publication Data

US 2022/0108866 A1 Apr. 7, 2022

Related U.S. Application Data

(63) Continuation of application No. 16/927,925, filed on Jul. 13, 2020, now Pat. No. 11,355,308.

(30) Foreign Application Priority Data

Aug. 30, 2019 (JP) .............................. JP2019-158502

(51) Int. Cl.
*H01J 37/22* (2006.01)
*H01J 37/244* (2006.01)
*H01J 37/28* (2006.01)

(52) U.S. Cl.
CPC .......... *H01J 37/226* (2013.01); *H01J 37/244* (2013.01); *H01J 37/28* (2013.01);
(Continued)

(58) Field of Classification Search
CPC ........ H01J 37/226; H01J 37/244; H01J 37/28; H01J 2237/2448; H01J 2237/2482; H01J 2237/281
See application file for complete search history.

(56) References Cited

U.S. PATENT DOCUMENTS 7,114,136 B2 * 9/2006 Chase ................. G06F 30/3312
324/501
8,586,920 B2 11/2013 Tsuno et al.
(Continued)

FOREIGN PATENT DOCUMENTS

EP 1267392 A4 5/2009
JP 2003100823 A 4/2003
(Continued)

OTHER PUBLICATIONS

Non Final Office Action dated Jun. 1, 2021 in U.S. Appl. No. 16/927,932.
(Continued)

*Primary Examiner* — David A Vanore
(74) *Attorney, Agent, or Firm* — Miles & Stockbridge, P.C.

(57) ABSTRACT

A method of detecting a defect in a device using a charged particle beam includes inputting a charged particle beam condition, a light condition, and electronic device circuit information, controlling a charged particle beam applied to a sample based on the electron beam condition, controlling light applied to the sample based on the light condition, detecting second electrons emitted from the sample by the application of the charged particle beam and the light, and generating a calculation netlist based on the electronic device circuit information, generating a light irradiation netlist based on the calculation netlist and the light condition, estimating a first irradiation result when the charged particle beam and the light are applied to the sample based
(Continued)

on the light irradiation netlist and the charged particle beam condition, and comparing the first irradiation result with a second irradiation result when the charged particle beam and the light are actually applied to the sample based on the electron beam condition.

16 Claims, 15 Drawing Sheets

(52) U.S. Cl.
CPC .......... *H01J 2237/2448* (2013.01); *H01J 2237/2482* (2013.01); *H01J 2237/2817* (2013.01)

(56) References Cited

U.S. PATENT DOCUMENTS

| | | | |
|---|---|---|---|
| 8,725,667 B2 | 5/2014 | Kaushal et al. | |
| 9,111,717 B2* | 8/2015 | Asahata | H01J 37/10 |
| 9,536,038 B1* | 1/2017 | Quinton | G06F 30/3312 |
| 9,916,965 B2 | 3/2018 | Bhaskar et al. | |
| 9,946,165 B2 | 4/2018 | Ypma et al. | |
| 10,026,589 B1 | 7/2018 | Monahan et al. | |
| 10,180,402 B2* | 1/2019 | Stoker | G01R 31/311 |
| 10,274,834 B2 | 4/2019 | Ypma et al. | |
| 10,642,162 B2 | 5/2020 | Ypma et al. | |
| 10,714,304 B2 | 7/2020 | Fukuda et al. | |
| 10,872,742 B2 | 12/2020 | Miwa et al. | |
| 10,879,037 B2 | 12/2020 | Tsuno et al. | |
| 10,971,330 B2* | 4/2021 | Torikawa | H01J 37/3056 |
| 10,971,347 B2 | 4/2021 | Nakamura et al. | |
| 11,011,348 B2 | 5/2021 | Bizen et al. | |
| 2003/0057971 A1 | 3/2003 | Nishiyama et al. | |
| 2003/0094572 A1 | 5/2003 | Matsui et al. | |
| 2008/0077376 A1* | 3/2008 | Belhaddad | G06F 30/20 703/13 |
| 2010/0115478 A1* | 5/2010 | Pedenon | G06F 30/30 716/136 |
| 2020/0264520 A1 | 8/2020 | Ypma et al. | |
| 2021/0043412 A1 | 2/2021 | Miwa et al. | |
| 2021/0043413 A1 | 2/2021 | Miwa et al. | |
| 2021/0066028 A1* | 3/2021 | Shirasaki | H01J 37/268 |

FOREIGN PATENT DOCUMENTS

| | | |
|---|---|---|
| JP | 2003151483 A | 5/2003 |
| JP | 2008130582 A | 6/2008 |
| TW | 201104452 A | 2/2011 |
| TW | 201516598 A | 5/2015 |
| TW | 201734439 A | 10/2017 |
| WO | 0171782 A1 | 9/2001 |
| WO | 2010052854 A1 | 5/2010 |

OTHER PUBLICATIONS

Non Final Office Action dated Jun. 2, 2021 in U.S. Appl. No. 16/928,931.
Office Action dated Jun. 22, 2021 in Taiwanese Application No. 109122980.
Office Action dated Jul. 14, 2021 in Taiwanese Application No. 109123139.
Office Action dated Jul. 14, 2021 in Taiwanese Application No. 109122986.
Office Action dated Sep. 6, 2022 in a Japanese Application No. 2019-158502.

* cited by examiner

```
R9 N013 N011 1k
X1 N001 N011 N021 NMOS
```

```
N001 = P1
N002 = P2
```

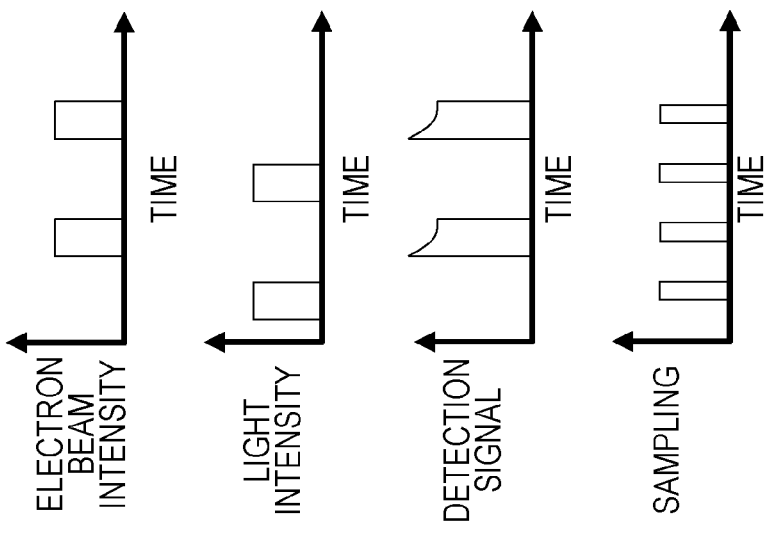
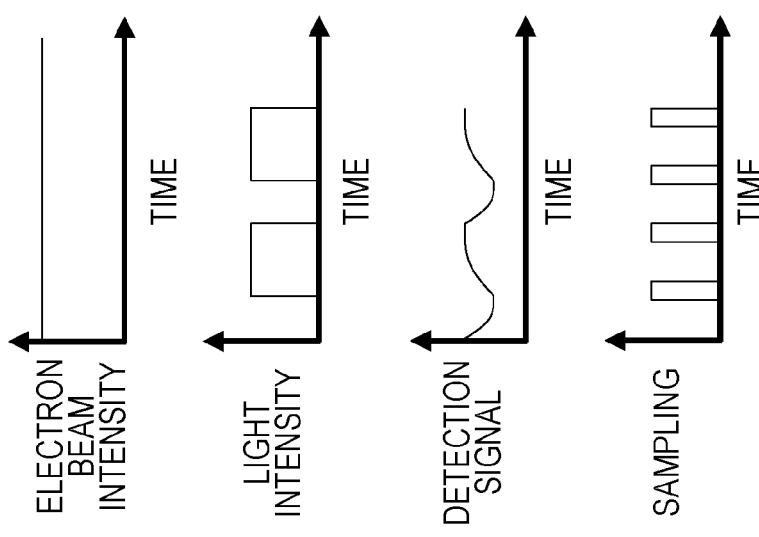
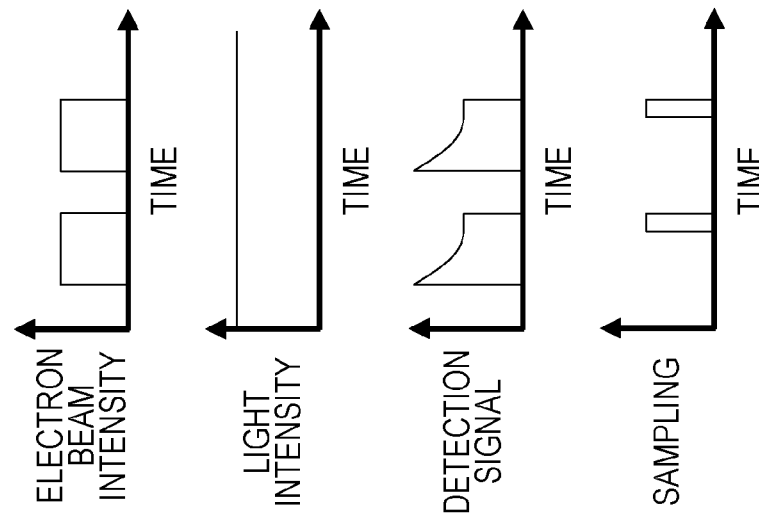

DEVICE DEFECT DETECTION METHOD USING A CHARGED PARTICLE BEAM

BACKGROUND OF THE INVENTION

1. Field of the Invention

The present invention relates to a charged particle beam device.

2. Description of the Related Art

Charged particle beam devices such as electron microscopes and ion microscopes are used for observing various samples having fine structures. For example, for the purpose of process management in a manufacturing process of semiconductor devices, a scanning electron microscope which is one of the charged particle beam devices is applied to measurement such as dimension measurement and defect inspection of semiconductor device patterns formed on a semiconductor wafer which is a sample.

A method of forming a potential contrast image based on secondary electrons obtained by irradiating the sample with an electron beam and evaluating an electric resistance of an element formed on the sample based on the analysis of the potential contrast image is known as one of sample analysis methods using the electron microscopes.

For example, JP 2003-100823 A discloses a method for calculating an electric resistance value from potential contrast and determining a defect. JP 2008-130582 A discloses a method of predicting characteristics of a defect such as an electric resistance value by creating, as an equivalent circuit, a netlist that describes information including electrical characteristics and connection information of circuit elements from potential contrast. JP 2003-151483 A discloses a method of changing potential contrast by irradiating a sample with light.

SUMMARY OF THE INVENTION

In the inspection and measurement of the semiconductor devices, a defect in electrical characteristics of the device in the manufacturing process needs to be detected. The detection of the electrical characteristics in an interaction between a plurality of devices can be realized by using the netlist of JP 2008-130582 A. However, the electrical characteristics may not be detected due to the interaction between the plurality of devices in some circuit configurations.

Thus, it is an object of the present invention to provide a method of detecting a defect in a device using a charged particle beam capable of measuring electrical characteristics of a device that cannot be measured by a method of the related art.

A brief description of an outline of a representative invention of inventions disclosed in the present application is as follows.

An aspect of the present invention provides a method of detecting a defect in a device using a charged particle beam according to a representative embodiment of the present invention includes inputting a charged particle beam condition related to a charged particle beam applied in order to estimate a circuit state of a sample, a light condition related to light applied in order to estimate the circuit state of the sample, and electronic device circuit information for defining a circuit of the sample, controlling the charged particle beam applied to the sample based on the charged particle beam condition, controlling the light applied to the sample based on the light condition, detecting secondary electrons emitted from the sample by the application of the charged particle beam and the light, and generating a calculation netlist based on the electronic device circuit information, generating a light irradiation netlist based on the calculation netlist and the light condition, estimating a first irradiation result when the charged particle beam and the light are applied to the sample based on the light irradiation netlist and the charged particle beam condition, and comparing the first irradiation result with a second irradiation result when the charged particle beam and the light are applied to the sample based on the charged particle beam condition.

The effects obtained by the representative invention of the inventions disclosed in the present application will be briefly described as follows.

That is, according to the representative embodiment of the present invention, it is possible to measure electrical characteristics of a device that cannot be measured by a method of the related art in consideration of an interaction between a plurality of devices.

BRIEF DESCRIPTION OF THE DRAWINGS

FIGS. 11A to 11D are explanatory diagrams of a circuit state estimation method according to a second embodiment of the present invention;

DESCRIPTION OF THE PREFERRED EMBODIMENTS

Figure 1:
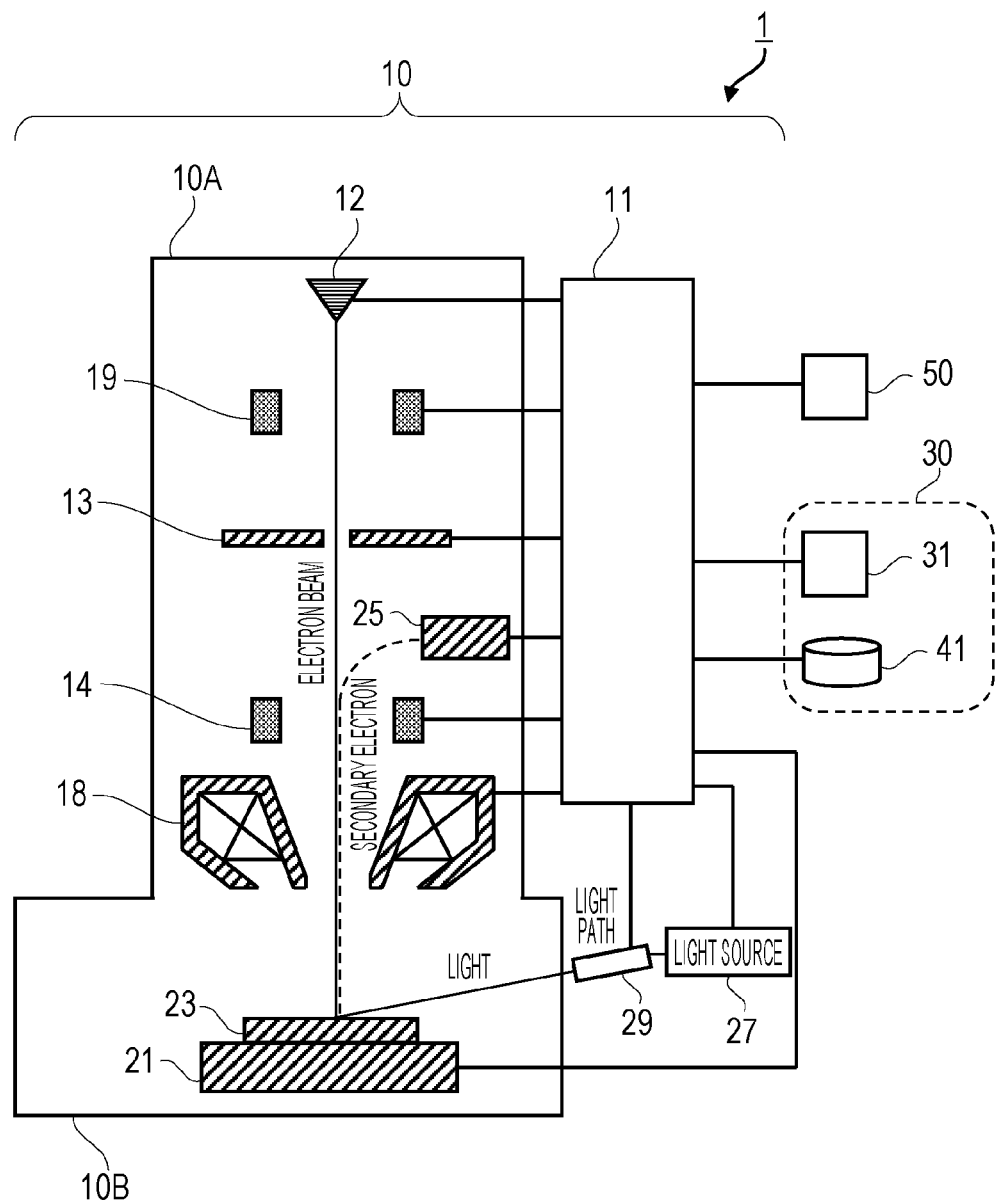
FIG. 1 is a schematic diagram illustrating an example of a configuration of a charged particle beam device according to a first embodiment of the present invention.

Hereinafter, embodiments of the present invention will be described with reference to the drawings. It should be noted that the embodiments to be described below are merely examples for realizing the present invention, and do not limit the technical scope of the present invention. In the embodiments, members having the same function are assigned by the same reference numeral, and redundant description thereof will be omitted unless particularly necessary.

First Embodiment

Configuration of Charged Particle Beam Device

Figure 2:
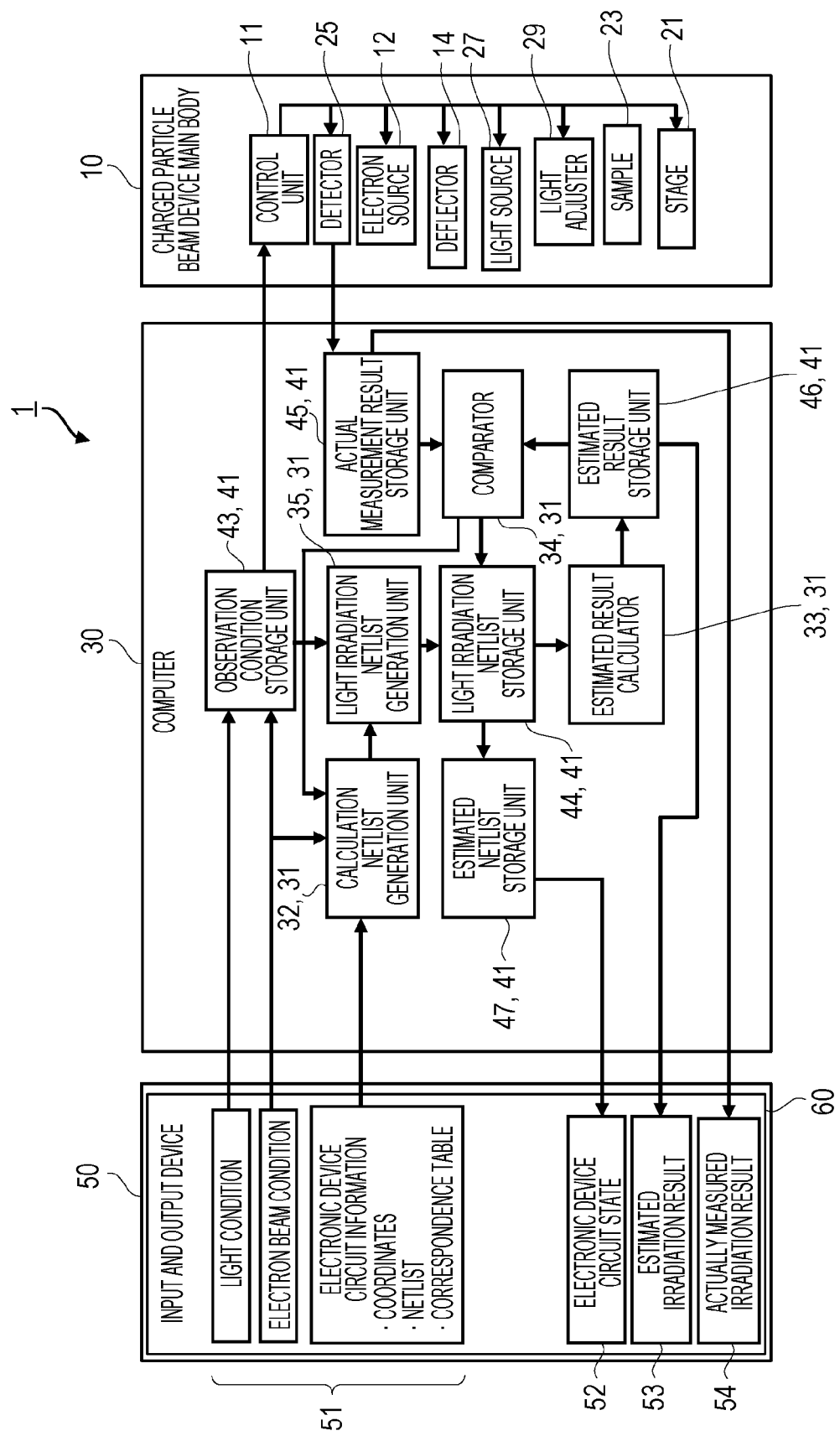
FIG. 2 is a block diagram illustrating an example of the configuration of the charged particle beam device according to the first embodiment of the present invention.

FIG. 1 is a schematic diagram illustrating an example of a configuration of a charged particle beam device according to a first embodiment of the present invention. FIG. 2 is a block diagram illustrating an example of the configuration of the charged particle beam device according to the first embodiment of the present invention. As illustrated in FIGS. 1 and 2, a charged particle beam device 1 includes a charged particle beam device main body 10, a computer 30, and an input and output device 50.

Charged Particle Beam Device Main Body

The charged particle beam device main body 10 is configured such that a lens barrel 10A is mounted in a sample chamber 10B in which an inspection sample 23 is accommodated and a control unit 11 is disposed outside the lens barrel 10A and the sample chamber 10B. In the lens barrel 10A, an electron source (charged particle source) 12 that applies an electron beam (charged particle beam), a pulse electron generator 19 that pulses the electron beam, a diaphragm 13 that adjusts an irradiation current for the applied electron beam, a deflector 14 that controls an irradiation direction of the electron beam, and an objective lens 18 that condenses the electron beam. Although not illustrated, a condenser lens is provided in the lens barrel 10A. The pulse electron generator 19 may not be provided as long as the electron beam is not pulsed.

The lens barrel 10A accommodates a detector 25 that detects secondary electrons emitted from the sample 23 by the application of the electron beam and outputs a detection signal based on the secondary electrons. The detection signal is used for generating a scanning electron microscopy (SEM) image, measuring a size of the sample 23, and measuring electrical characteristics.

A stage 21 and the sample 23 are accommodated in the sample chamber 10B. The sample 23 is mounted on the stage 21. The sample 23 is, for example, a semiconductor wafer including a plurality of semiconductor devices or an individual semiconductor device. A stage drive mechanism (not illustrated) is provided at the stage 21, and is movable in the sample chamber 10B under the control of the control unit 11.

A light source 27 and a light adjuster 29 are arranged outside the sample chamber 10B. The light source 27 supplies light applied to the sample 23. The light source 27 has, for example, a semiconductor element such as a light emitting diode (LED) or a laser diode (LD). The light source 27 may be constituted by multiple types of light sources having different wavelengths. The light adjuster 29 is a functional block that adjusts an optical path and polarization of the light such that the light applied from the light source 27 is applied to a predetermined area of the sample 23. The control unit 11, the light source 27, and the light adjuster 29 constitute a light control system that controls the light applied from the light source 27. The light source 27 and the light adjuster 29 may be arranged in the sample chamber 10B.

The control unit 11 is a functional block that controls components of the charged particle beam device main body 10. For example, the control unit 11 controls operations of the electron source 12, the pulse electron generator 19, the diaphragm 13, the deflector 14, and the objective lens 18 based on an observation condition input from the computer 30. Specifically, the control unit 11 controls the operations of the electron source 12, the pulse electron generator 19, the diaphragm 13, the deflector 14, and the objective lens 18 based on an electron beam condition (charged particle beam condition) included in the observation condition. The control unit 11, the electron source 12, the pulse electron generator 19, the diaphragm 13, the deflector 14, and the objective lens 18 constitute a charged particle beam control system that controls the electron beam.

The control unit 11 moves the sample 23 to a predetermined position by controlling the stage drive mechanism based on, for example, the electron beam condition input from the computer 30. The control unit 11 performs control related to processing for detecting the secondary electrons by means of the detector 25 by controlling the supply of power and the supply of a control signal to the detector 25.

The control unit 11 controls operations of the light source 27 and the light adjuster 29 based on the observation condition. Specifically, the control unit 11 controls the light source 27 and the light adjuster 29 based on a light condition included in the observation condition. More specifically, for example, the control unit 11 controls the amount of light and a wavelength of the light applied from the light source 27. The control unit causes the light adjuster 29 to adjust a traveling direction and polarization of the light applied from the light source 27.

The control unit 11 is realized by a program executed by a processor such as a CPU. The control unit 11 may be constituted by, for example, a field-programmable gate array (FPGA) or an application specific integrated circuit (ASIC).

Computer

As illustrated in FIG. 1, the computer 30 includes a calculator 31 and a storage device 41. The calculator 31 is a functional block that estimates a circuit (or equivalent circuit) of the sample 23. As illustrated in FIG. 2, for example, the calculator 31 includes a calculation netlist generation unit 32, a light irradiation netlist generation unit 35, an estimated result calculator 33, and a comparator 34.

The calculation netlist generation unit 32 generates a calculation netlist corresponding to the sample 23 based on electronic device circuit information and an electron beam condition to be described below. The calculation netlist generation unit 32 also updates the calculation netlist based on a comparison result of the comparator 34.

The light irradiation netlist generation unit 35 generates a light irradiation netlist corresponding to the sample 23 based on the calculation netlist generated by the calculation netlist generation unit and the light condition stored in an observation condition storage unit 43. The light irradiation netlist refers to a netlist in consideration of a change in the electrical characteristics of the sample 23 when light is applied based on the light condition in a circuit defined by the calculation netlist.

The estimated result calculator 33 estimates the irradiation result of the electron beam and the light based on the light irradiation netlist generated by the light irradiation netlist generation unit 35. The comparator 34 compares an estimated irradiation result (first irradiation result) estimated by the estimated result calculator 33 with an actually measured irradiation result (second irradiation result) actually measured under the same condition.

In addition to the aforementioned processing, the calculator 31 performs processing related to the display of the estimated irradiation result, the actually measured irradiation result, and the netlist identified for the sample 23 (hereinafter, also referred to as an "estimated netlist") and processing related to the generation of the inspection image (SEM image) of the sample 23 based on the detection signal, measurement of the size of the sample 23, and the measurement of the electrical characteristics of the sample 23.

The calculator 31 may be realized by a program executed by a processor such as a CPU or may be constituted by an FPGA or an ASIC as in the control unit 11.

The storage device 41 includes the observation condition storage unit 43, a light irradiation netlist storage unit 44, an actual measurement result storage unit 45, an estimated result storage unit 46, and an estimated netlist storage unit 47.

The observation condition storage unit 43 stores an electron beam condition related to electron beam irradiation selected by a user. The observation condition storage unit 43 stores the light condition related to the light irradiation selected by the user. That is, the observation condition includes the electron beam condition and the light condition. When observation is performed without applying the light, the observation condition may not include the light condition. The electron beam condition and the light condition for selection are stored in, for example, a database (not illustrated). A plurality of electron beam conditions and a plurality of light conditions are registered in the database, and the user selects optimum electron beam condition and light condition for estimating the electrical characteristics of the sample 23 from the database. The database may be provided inside the charged particle beam device 1, or may be provided outside the charged particle beam device 1.

The light irradiation netlist storage unit 44 stores the light irradiation netlist generated by the light irradiation netlist generation unit 35. The actual measurement result storage unit 45 stores the actually measured irradiation result for the sample 23 actually measured based on the observation condition based on the detection signal output from the detector 25. The actually measured irradiation result stored in the actual measurement result storage unit 45 may be the detection signal output from the detector 25, or may be the SEM image based on the detection signal. The estimated result storage unit 46 stores the estimated irradiation result for the sample 23 estimated by the estimated result calculator 33.

The storage device 41 is constituted of, for example, a nonvolatile memory such as a flash memory. A part of each storage unit included in the storage device 41 may be constituted by a volatile memory such as a dynamic random access memory (DRAM) or a static random access memory (SRAM). Each storage unit included in the storage device 41 may be provided as a separate device, or each storage area may be provided in one storage device.

Input and Output Device

The input and output device 50 is a functional block that operates the charged particle beam device 1, selects the electronic device circuit information, the light condition, and the electron beam condition, and displays an electronic device circuit state in the sample 23 based on the estimated netlist, the estimated irradiation result for the sample 23, and the actually measured irradiation result. The input and output device 50 includes, for example, a touch panel type display 60. The display 60 displays, for example, an operation panel of the charged particle beam device 1, a selection unit 51 that selects the electronic device circuit information, the electron beam condition, and the light condition, an electronic device circuit state 52, an estimated irradiation result 53, and an actually measured irradiation result 54.

Circuit State Estimation Method for Sample

Figure 3:
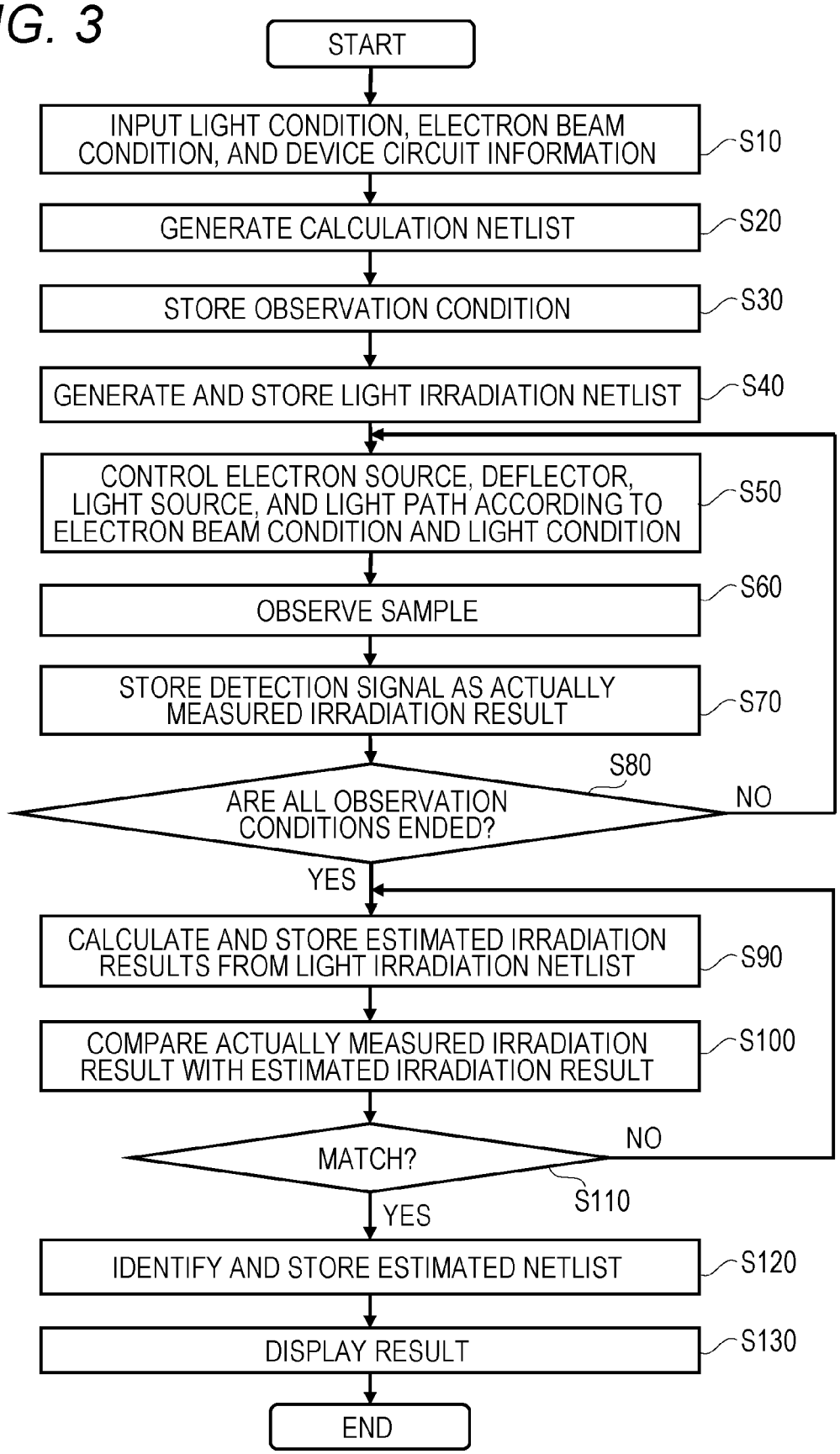
FIG. 3 is a flowchart illustrating an example of a circuit state estimation method.

Next, a circuit state estimation method for the sample 23 will be described. In the present embodiment, the calculation netlist is generated from the input electronic device circuit information, and the light irradiation netlist is generated from the calculation netlist and the input light condition. The netlist for the sample is estimated by comparing the estimated irradiation result estimated by using the light irradiation netlist and the electron beam condition with the actually measured irradiation result actually measured. FIG. 3 is a flowchart illustrating an example of the circuit state estimation method. In FIG. 3, the estimation of the circuit for the sample is performed in steps S10 to S130. The circuit state and the electrical characteristics of the sample are included.

Figure 4:
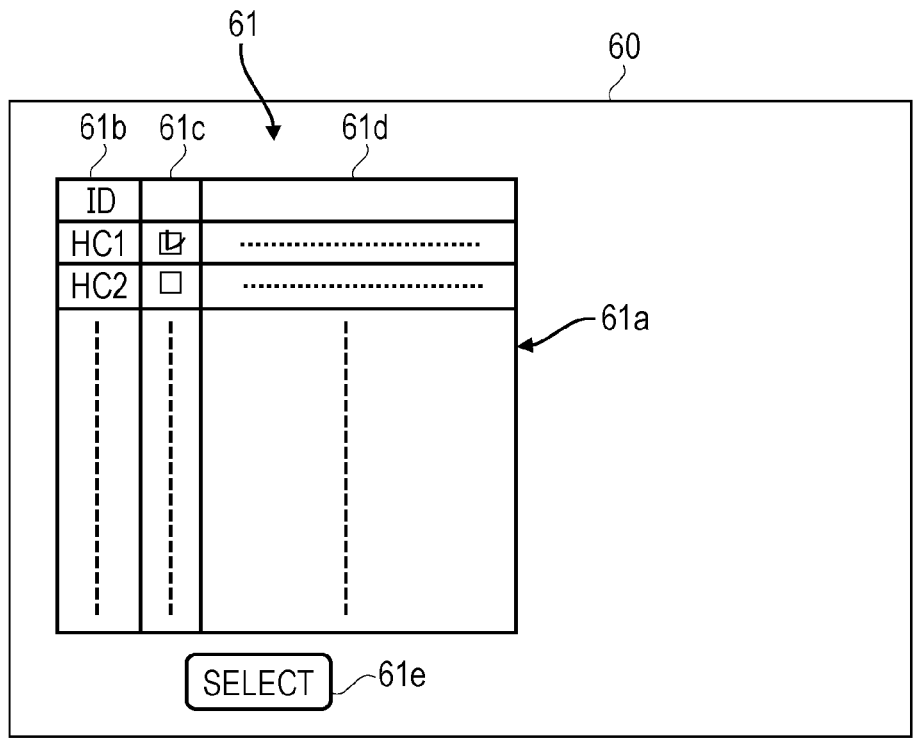
FIG. 4 is a diagram illustrating an example of a selection screen of a light condition.

When circuit state estimation processing is started, the electron beam condition, the light condition, and the electronic device circuit information are input (step S10). FIG. 4 is a diagram illustrating an example of a selection screen of the light condition. For example, a list 61a of the light condition registered in a database (not illustrated) and a selection decision button 61e are displayed on a light condition selection screen 61 of FIG. 4. The list 61a includes an ID display field 61b of the registered light condition, a selection field 61c of the light condition, and a detailed display field 61d of each light condition. The light condition includes, for example, control information of the light source 27 and the light adjuster 29 such as intensity, wavelength, and polarization (s-polarized light or p-polarized light) of light to be applied, coordinates of an irradiation position, a period, and a delay time.

The user selects the light condition for irradiating the sample 23 to be measured with the light from the light condition selection screen 61 displayed on the display 60. In the present embodiment, one light condition is selected. Specifically, the user selects any light condition. The selection of the light condition is completed by checking a check box of the light condition to be selected and touching the selection decision button 61e. FIG. 4 illustrates a case where the light condition with an ID of HC1 is selected. The selected light condition is transmitted to and stored in the observation condition storage unit 43 of FIG. 2.

Figure 5:
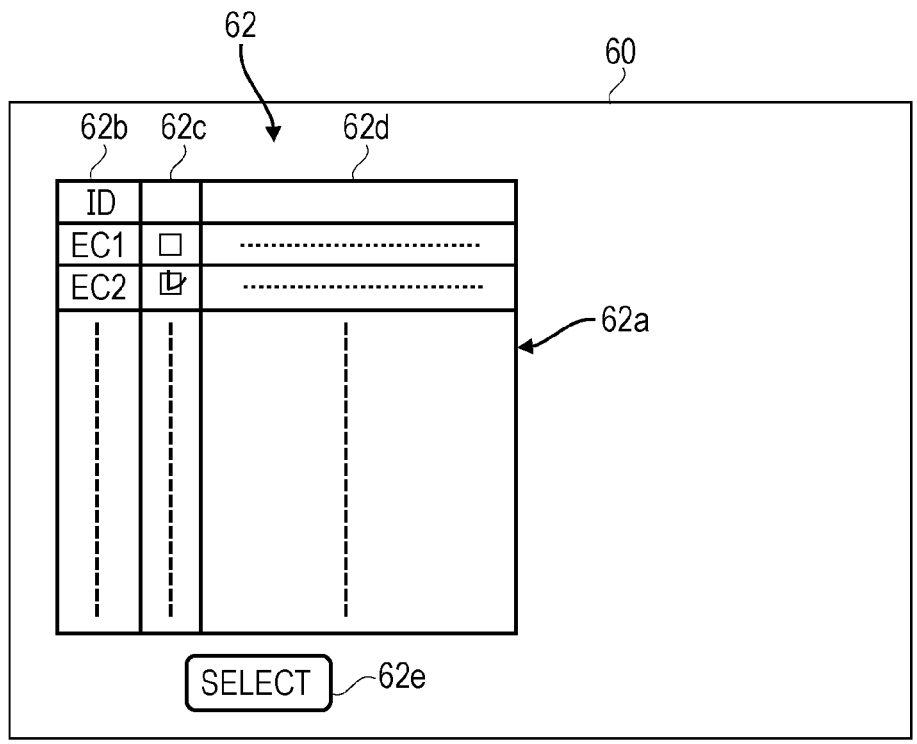
FIG. 5 is a diagram illustrating an example of a selection screen of an electron beam condition.

FIG. 5 is a diagram illustrating an example of a selection screen of the electron beam condition. For example, a list 62a of the electron beam condition registered in a database (not illustrated) and a selection decision button 62e are displayed on an electron beam condition selection screen 62 of FIG. 5. The list 62a includes an ID display field 62b of the registered electron beam condition, a selection field 62c of the electron beam condition, and a detailed display field 62d of each electron beam condition. The electron beam condition includes, for example, information such as an acceleration voltage, a magnification, and a scan condition.

The user selects an arbitrary electron beam condition from the electron beam condition selection screen 62 displayed on the display 60. Specifically, the user completes the selection of the electron beam condition by checking a check box of the electron beam condition to be selected and touching the selection decision button 62e. FIG. 5 illustrates a case where the electron beam condition with an ID of EC2 is selected. The selected electron beam condition is transmitted to and stored in the observation condition storage unit 43 of FIG. 2.

In the setting of the electron beam condition, an electron beam pulsing condition (modulation condition) may also be used together as necessary. The electron beam pulsing condition may be used together with the electron beam condition, or the electron beam pulsing condition alone may be set as the electron beam condition.

Figure 6:
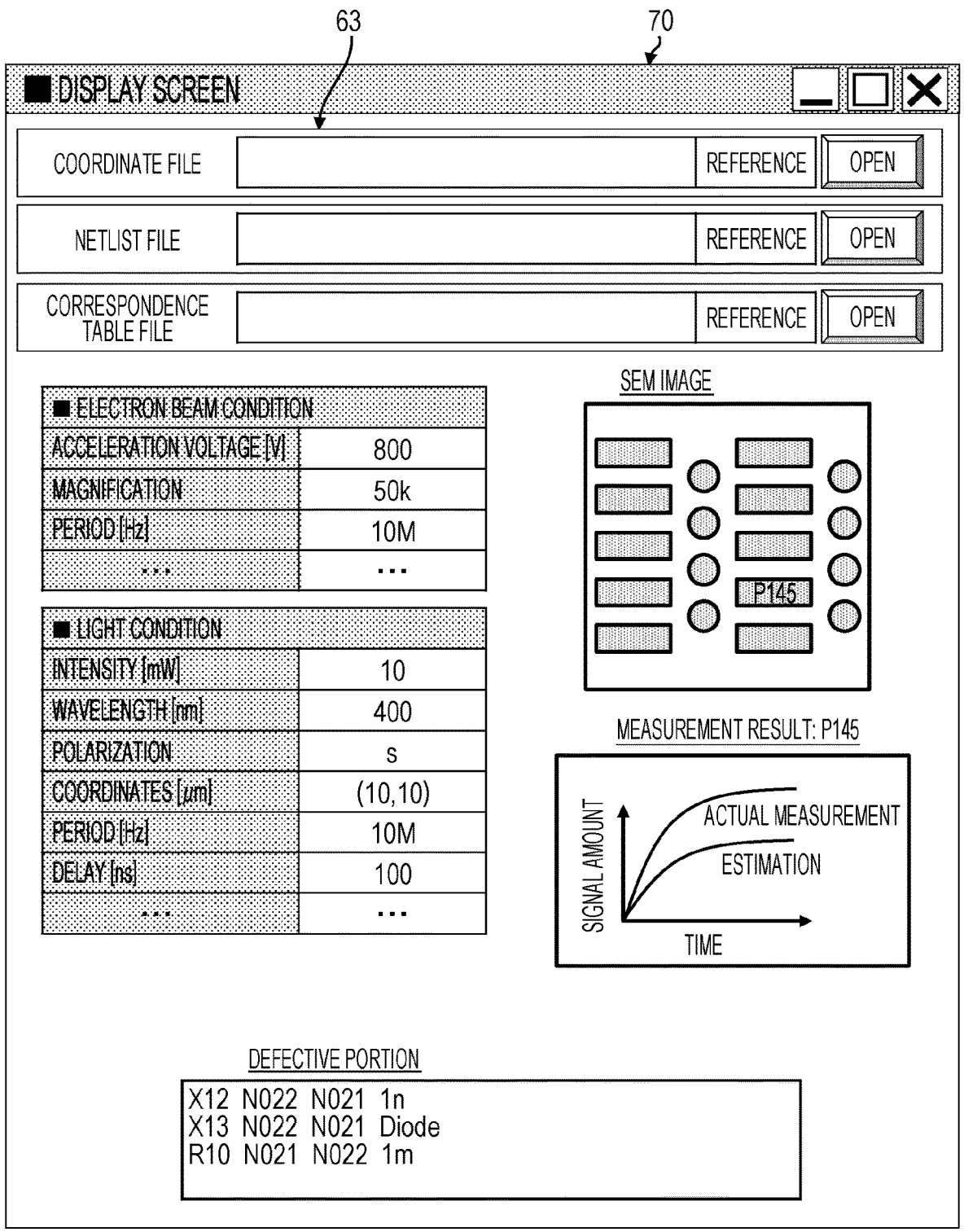
FIG. 6 is a diagram illustrating an example of a display screen including a selection screen of electronic device circuit information.

FIG. 6 is a diagram illustrating an example of a display screen including a selection screen of the electronic device circuit information. An electronic device circuit information selection screen 63 is displayed on a display screen 70. The electron beam condition and the light condition are also displayed on the electronic device circuit information selection screen 63.

Figures 7A, 7B, 7C:
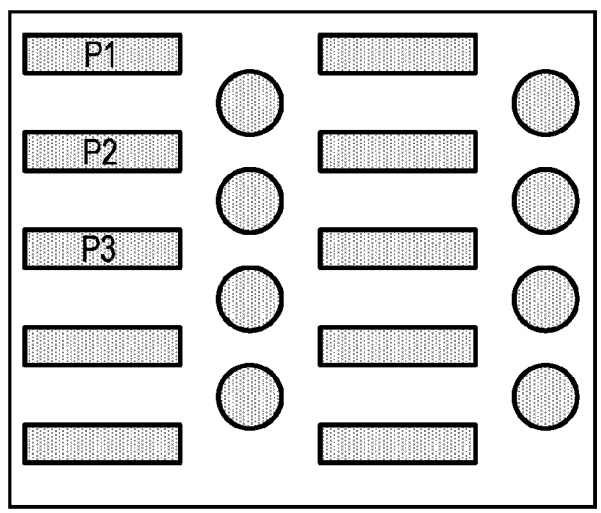
FIGS. 7A to 7C are diagrams illustrating specific examples of the electronic device circuit information.

The electronic device circuit information includes, for example, coordinates, a netlist, and a correspondence table. The coordinates are, for example, information indicating a position of a plug electrode disposed on a surface of the sample. The netlist is information indicating a circuit configuration of the sample. The correspondence table is information for associating the coordinates of the plug electrodes with the netlist. FIGS. 7A to 7C are diagrams illustrating specific examples of the electronic device circuit information. FIG. 7A illustrates an example of the coordinates. FIG. 7B illustrates an example of the netlist. FIG. 7C illustrates an example of the correspondence table. In addition to these pieces of information, the electronic device circuit information may include information on a shape and a material of the device.

The user selects the electronic device circuit information corresponding to the sample 23 from the electronic device circuit information selection screen 63 of the display screen 70. Specifically, the user displays a list of each item registered in a database (not illustrated) by touching a button of "open" of each item. The user selects an item of the electronic device circuit information corresponding to the sample 23 from the displayed list. Information (for example, ID) on each selected item is displayed on the electronic device circuit information selection screen 63. When a reference button is touched, details of the selected information are displayed. The selected electronic device circuit information is transmitted to the calculation netlist generation unit 32 of FIG. 2. The netlist may include a model indicating a defect of the circuit configuration of the sample 23.

In step S10, when the selection decision button 61e is touched and the selection of the light condition is completed, the light condition selection screen 61 may be erased, and the electron beam condition selection screen 62 may be displayed. When the selection of the light condition is completed, the electron beam condition selection screen 62 may be displayed so as to be superimposed on the light condition selection screen 61. A button for re-displaying the light condition selection screen 61 on the electron beam condition selection screen 62 may be provided.

In step S20, the calculation netlist generation unit 32 generates the calculation netlist based on the electronic device circuit information selected by the user. For example, the calculation netlist generation unit 32 generates the calculation netlist by combining information (including parameters) included in each item (coordinates, netlist, and correspondence table) of the selected electronic device circuit information.

In step S30, the light condition and the electron beam condition selected in step S10 are stored as the observation condition in the observation condition storage unit. The processing of step S30 may be performed in step S10. In this case, step S30 may be appropriately omitted.

In step S40, the light irradiation netlist is generated. The light irradiation netlist generation unit 35 generates the light irradiation netlist based on the calculation netlist generated by the calculation netlist generation unit 32 and the light condition stored in the observation condition storage unit 43. The generated light irradiation netlist is stored in the light irradiation netlist storage unit 44.

Specifically, the light irradiation netlist generation unit 35 generates the light irradiation netlist including light dependence (the amount of change in the electrical characteristics that changes during light irradiation) of the light irradiation netlist. That is, the light irradiation netlist includes information such as the amount of change in the electrical characteristics when conditions such as the amount of light and an irradiation range of the light are different. For example, light dependence information is used for generating the light irradiation netlist in consideration of the light dependence. The light dependence information includes, for example, a netlist when the light is applied (light ON) and a netlist when the light is not applied (light OFF) for each circuit configuration. The netlist when the light is applied includes each netlist when a value of light irradiation NL indicating a value of the amount of light is different. The light dependence information may include light dependence information between a plurality of devices.

The light dependence of the light irradiation netlist depends on a size and a shape of the device. Thus, the light irradiation netlist generation unit 35 generates the light irradiation netlist by using information such as a shape and a material of the device included in the electronic device circuit information and a light dependence database. When the electronic device circuit information is selected, the user also selects information such as the shape and the material of the device. For example, the user also selects the light dependence information together with the selection of the light condition.

The light irradiation netlist generation unit 35 generates the light irradiation netlist in consideration of the amount of change in the electrical characteristics during the light irradiation by using the information such as the calculation netlist, the selected light condition, the information such as the shape and the material of the selected device, and the selected light dependence information. The information such as the shape and the material of the device may already be included in the calculation netlist. The light dependence information may be included in the light condition. The light dependence information may be input together with the electronic device circuit information by the user, may be calculated by the calculator 31 based on the input electronic device circuit information, or may be stored in a database on the device side. As described above, it is possible to improve estimation accuracy of the electrical characteristics by generating the light irradiation netlist in consideration of the light dependence.

The light dependence information may be stored in the database that stores the electron beam condition or the light condition, or may be stored in another database.

Figure 8A:
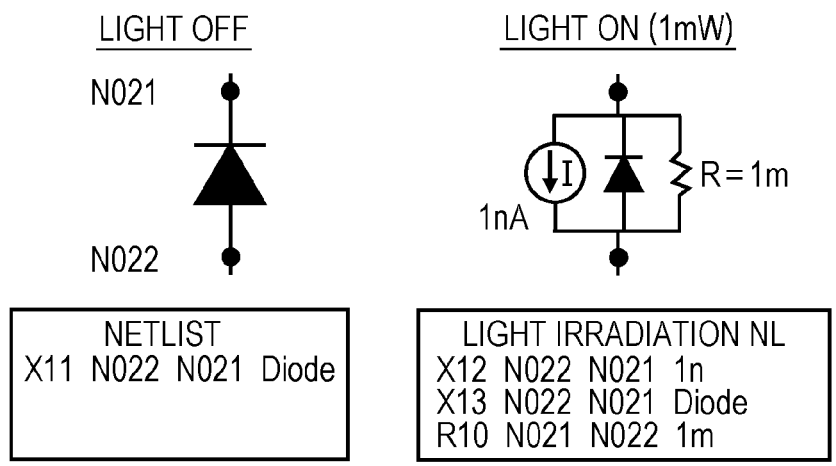
FIGS. 8A to 8C are diagrams illustrating comparison between a calculation netlist and a light irradiation netlist.
Figure 8B:
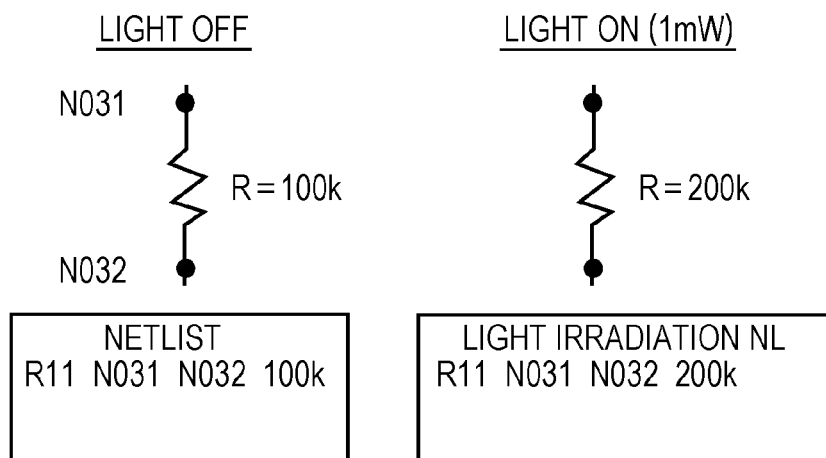
Figure 8C:
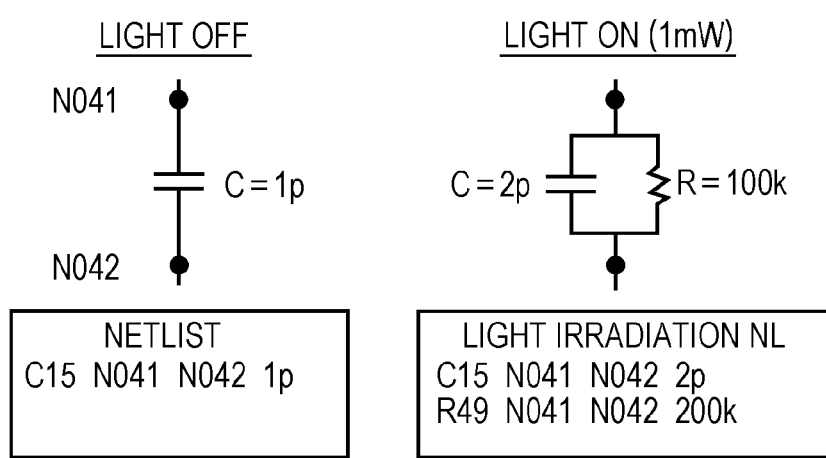

FIGS. 8A to 8C are diagrams illustrating comparison between the calculation netlist and the light irradiation netlist. FIGS. 8A to 8C are examples of the light dependence information. FIG. 8A is a diagram illustrating the comparison between the netlists for a diode. The calculation netlist (that is, the netlist illustrating the circuit configuration when the light is not applied) is illustrated on a left side of FIG. 8A. Meanwhile, the light irradiation netlist is illustrated on a right side of the diagram. In the example of FIG. 8A, in the light irradiation netlist, a resistive element connected between both terminals of the diode and a netlist of a current flowing between both the terminals are newly added.

FIG. 8B is a diagram illustrating the comparison between the netlists for the resistive element. The calculation netlist is illustrated on a left side of FIG. 8B, and the light irradiation netlist is illustrated on a right side of the diagram. In the example of FIG. 8B, a resistance value of the resistive element in the light irradiation netlist is changed.

FIG. 8C is a diagram illustrating the comparison between the netlists for a capacitor. The calculation netlist is illustrated on a left side of FIG. 8C, and the light irradiation netlist is illustrated on a right side of the diagram. In the example of FIG. 8C, in the light irradiation netlist, a resistive element connected between both terminals of the capacitor is newly added, and a capacitance of the capacitor is changed. The change in the electrical characteristics of the circuit element by the light irradiation is not limited to these examples. The value (for example, the amount of light) of the light irradiation NL depends on the light condition.

In step S50, the sample 23 is irradiated with the electron beam and the light. The light condition and the electron beam condition stored in the observation condition storage unit 43 are transmitted to the control unit 11 of the charged particle beam device main body 10. The control unit 11 irradiates the sample 23 with the electron beam by controlling the units constituting the charged particle beam control system based on the received electron beam condition. The control unit 11 irradiates the sample 23 with the light by controlling the light source 27 and the light adjuster 29 based on the received light condition.

In step S60, the sample 23 is observed when the sample 23 is irradiated with the light and the electron beam. For example, when the sample is irradiated with the electron beam and the light, the sample 23 emits secondary electrons. When the secondary electrons emitted from the sample 23 are detected, the detector 25 outputs a predetermined detection signal corresponding to the number of secondary electrons or irradiation energy to the computer 30 (calculator 31).

In step S70, the actually measured irradiation result when the sample 23 is irradiated with the actually measured electron beam or light is stored. For example, the calculator 31 may store, as the electron beam irradiation result, the detection signal (signal waveform) output from the detector 25 in the actual measurement result storage unit 45. The calculator 31 may generate the inspection image (SEM image) based on the detection signal, and may store, as the actually measured irradiation result, the inspection image in the actual measurement result storage unit 45. A decay rate of the detection signal and the amount of light that causes a change in the detection signal may be stored as the actually measured irradiation result. The calculator 31 may measure the amount of electrified charges of the sample 23 based on the detection signal, and may store the measured amount of electrified charges in the actual measurement result storage unit 45. The calculator 31 may detect brightness of the inspection image or brightness of each pixel, and may store the detected brightness in the actual measurement result storage unit 45.

In step S80, it is determined whether or not the observation under all the set observation conditions is completed. When the observation under all the observation conditions is not completed (NO), the processing of steps S50 to S70 is performed again under different observation conditions. Meanwhile, when the observation under all the observation conditions is completed (YES), the processing of step S90 is performed.

In step S90, the irradiation results of the electron beam and the light are estimated. The estimated result calculator 33 estimates the irradiation results of the electron beam and the light for the sample 23 by a circuit simulation based on the light irradiation netlist stored in the light irradiation netlist storage unit 44 and the electron beam condition stored in the observation condition storage unit 43. The items of the estimated irradiation result are, for example, the detection signal (signal waveform) output from the detector 25, the amount of electrified charges, the inspection image, the brightness of the inspection image, and the brightness of each pixel of the inspection image. The estimated irradiation result is stored in the estimated result storage unit 46.

In step S100, the actually measured irradiation result and the estimated irradiation result are compared. The comparator 34 compares the actually measured irradiation result with the estimated irradiation result for each item of the electron beam irradiation result. The comparator 34 compares between the detection signals for each irradiation area of the electron beam or each pixel of the detection image, for example. For example, the comparator 34 compares the amount of electrified charges, the inspection image, the brightness of the inspection image, and the brightness of each pixel of the inspection image. For example, the comparator 34 generates the comparison result by digitizing these irradiation results and calculating magnitude of a difference between the actual electron beam irradiation result and the estimated electron beam irradiation result for each item. The comparator 34 may compare all of these items, or may only compare some of the items.

In step S110, it is determined whether or not the actually measured irradiation result and the estimated irradiation result match based on the comparison result calculated in step S100. For example, when a value of the comparison result is "0", the comparator 34 determines that these irradiation results match. In contrast, when a value of the comparison result is not "0", the comparator 34 determines that these comparison results do not match. However, in reality, since these irradiation results rarely match completely, it is necessary to consider a measurement error within a predetermined range.

Thus, when the value of the comparison result is equal to or less than a predetermined threshold value, the comparator 34 may determine that the irradiation results match. The predetermined threshold value is set for each item. In a case where the comparison is performed for a plurality of items, the comparator 34 may determine that the irradiation results match only when the comparison result of all the compared items is equal to or less than the threshold value. When the comparison result is equal to or less than the threshold value in the items of a predetermined ratio or more, the comparator 34 may determine that the irradiation results match.

When the comparator 34 determines that these electron beam irradiation results do not match (NO) in step S110, the processing of steps S90 to S100 is performed again. In step S90, the calculator 31 updates the light irradiation netlist again by changing parameters included in the light irradiation netlist stored in the light irradiation netlist storage unit 44. The estimated result calculator 33 re-estimates the irradiation result by using the light irradiation netlist in which the parameters are changed.

At this time, the calculator 31 may update the calculation netlist by updating the parameters. In this case, for example, the comparator 34 transmits the comparison result to the calculation netlist generation unit 32, and the calculation netlist generation unit 32 updates the calculation netlist. The calculation netlist generation unit 32 changes a parameter value used for generating the immediately preceding calculation netlist based on the comparison result, and generates the calculation netlist by using the changed parameter value, for example. At this time, the calculation netlist generation unit 32 may change the parameter value based on the comparison result for the plurality of items. The calculation netlist generation unit 32 may set the parameter of which the parameter value is changeable in advance, and may update the calculation netlist while changing the parameter value of only the changeable parameter. Specific examples of the parameter include values such as the resistance value of the resistive element and the capacitance of the capacitor. Specific examples of the parameter include a resistance value of an additional resistor which is not present in a design but is visible by the irradiation of the light.

The processing of steps S90 to S110 is repeatedly executed until the estimated irradiation result and the actually measured irradiation result match.

Meanwhile, when the comparator 34 determines that these electron beam irradiation results match (YES) in step S110, the processing of step S120 is performed. In step S120, the calculator 31 (comparator 34) determines that the light irradiation netlist stored in the light irradiation netlist storage unit 44 is identifiable as the netlist describing the circuit of the sample 23 during the light irradiation, stores, as the estimated netlist, this light irradiation netlist in the estimated netlist storage unit 47. In addition to the estimated netlist, the correspondence table that associates the coordinates of the plug electrode in the inspection image with each node of the estimated netlist may be stored in the estimated netlist storage unit 47.

In step S130, the estimated irradiation result and the actually measured irradiation result are output to the input and output device 50. For example, the estimated netlist stored in the estimated netlist storage unit 47, the estimated irradiation result stored in the estimated result storage unit 46, and the actually measured irradiation result stored in the actual measurement result storage unit 45 are output to the input and output device 50, and are displayed on the display 60. In FIG. 6, for example, the SEM image, an optical response result of a predetermined plug electrode, and a detection result of a defective portion of the circuit are displayed on the display screen 70. The waveform of the detection signal and a change history of the parameter may be displayed on the display screen 70.

The processing of steps S50 to S80 and the processing of step S90 may be performed in parallel.

Artificial intelligence (AI) using a method such as machine learning or deep learning may be used for the processing such as the estimation of the electron beam irradiation result in step S90 and the update of the parameter of the light irradiation netlist.

EXAMPLES

Figure 9A:
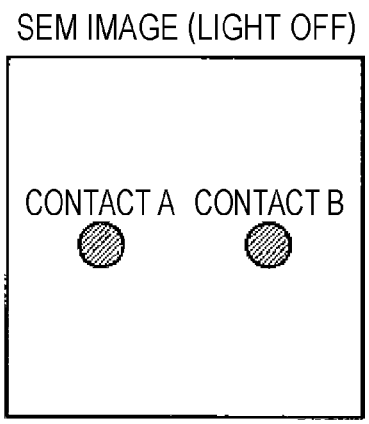
FIGS. 9A to 9C are diagrams illustrating specific examples of the circuit state estimation method.
Figure 9A:
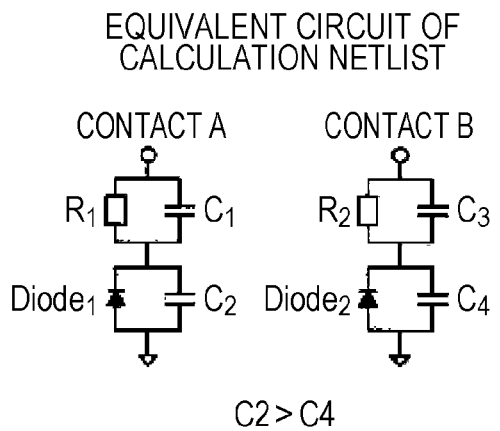
Figure 9B:
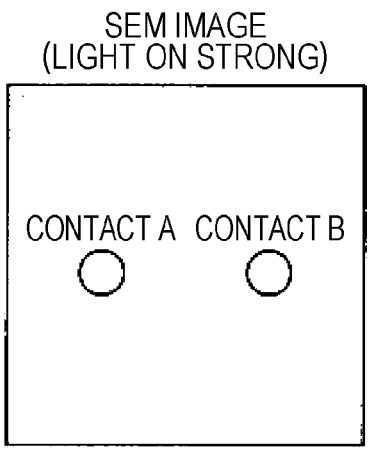
Figure 9B:
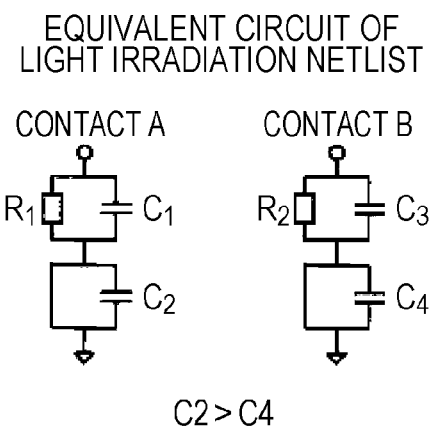
Figure 9C:
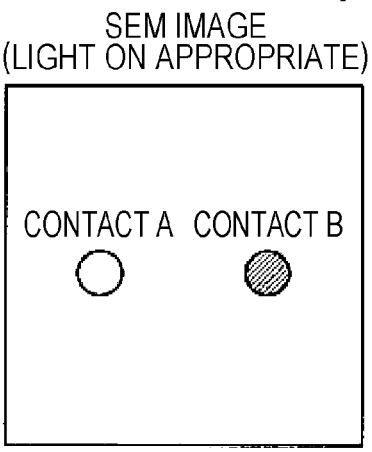
Figure 9C:
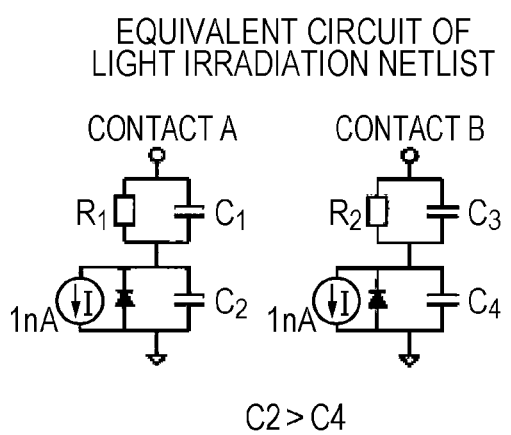

FIGS. 9A to 9C are diagrams illustrating a specific example of the circuit state estimation method. FIGS. 9A to 9C illustrate a case where circuit states of a circuit connected to a contact A and a circuit connected to a contact B are estimated. In FIGS. 9A to 9C, the SEM image is illustrated on a left side, and the equivalent circuit of the calculation netlist is illustrated on a right side. FIG. 9A illustrates a case where contacts A and B are not irradiated with light. In this case, a diode on the circuit acts as a barrier, a current due to electron beam irradiation does not flow, and the SEM images of the contacts A and B are dark. In this state, it is difficult to estimate the states of both the circuits.

FIG. 9B illustrates a case where the contacts A and B are irradiated with strong light. In this case, a current flowing through the diode is large due to the light, and both terminals of capacitors C2 and C4 are substantially short-circuited. Both the contacts A and B are bright on the SEM images at this time, and a difference therebetween cannot be recognized. In this case, it is difficult to estimate the states of both the circuits.

FIG. 9C illustrates a case where the contacts A and B are respectively irradiated with appropriate light. In this case, since the amount of electricity stored in the contact changes depending on the capacitances of the capacitors C2 and C4, the contact A is bright and the contact B is dark on the SEM image. In this state, a difference between both the circuits is clarified, and the circuit states can be estimated. As described above, it is necessary to adjust the amount of light in the estimation of the circuit states.

Main Effects of Present Embodiment

According to the present embodiment, the calculation netlist is generated based on the electronic device circuit information, the light irradiation netlist is generated based on the calculation netlist and the light condition, and the electron beam irradiation result when the sample is irradiated with the electron beam is estimated based on the light irradiation netlist and the electron beam condition. The estimated irradiation result is compared with the irradiation result when the sample 23 is irradiated with the electron beam and the light based on the electron beam condition and the light condition.

According to this configuration, it is possible to measure the electrical characteristics of the device which cannot be measured by the method of the related art while the light is applied and the circuit is activated. That is, according to this configuration, it is possible to measure the electrical characteristics of the device that cannot be measured without the irradiation of the light. Since the circuit can be activated, it is possible to estimate the electrical characteristics in consideration of an interaction between the plurality of circuits.

According to the present embodiment, when the estimated irradiation result and the actually measured irradiation result are different, the light irradiation netlist is updated. Specifically, the calculator 31 updates the light irradiation netlist by changing the parameter included in the light irradiation netlist. According to this configuration, the amount of calculation can be suppressed, and a load on the calculator 31 can be suppressed.

According to the present embodiment, the electron beam irradiation result includes any one of the detection signal, the inspection image based on the detection signal, the brightness of the inspection image, and the brightness of each pixel of the inspection image. According to this configuration, it is possible to collate the irradiation results according to various forms based on the detection signal.

According to the present embodiment, the netlist of the electronic device circuit information includes the model indicating the defect of the sample 23. According to this configuration, it is possible to easily detect a defect (manufacturing defect) of the sample 23, and it is possible to improve accuracy of circuit state estimation.

According to the present embodiment, the electronic device circuit information includes the netlist, the coordinates, and the correspondence table. With this configuration, the position of the electrode is clarified, and the calculation netlist is easily generated.

Modification Example

Figure 10:
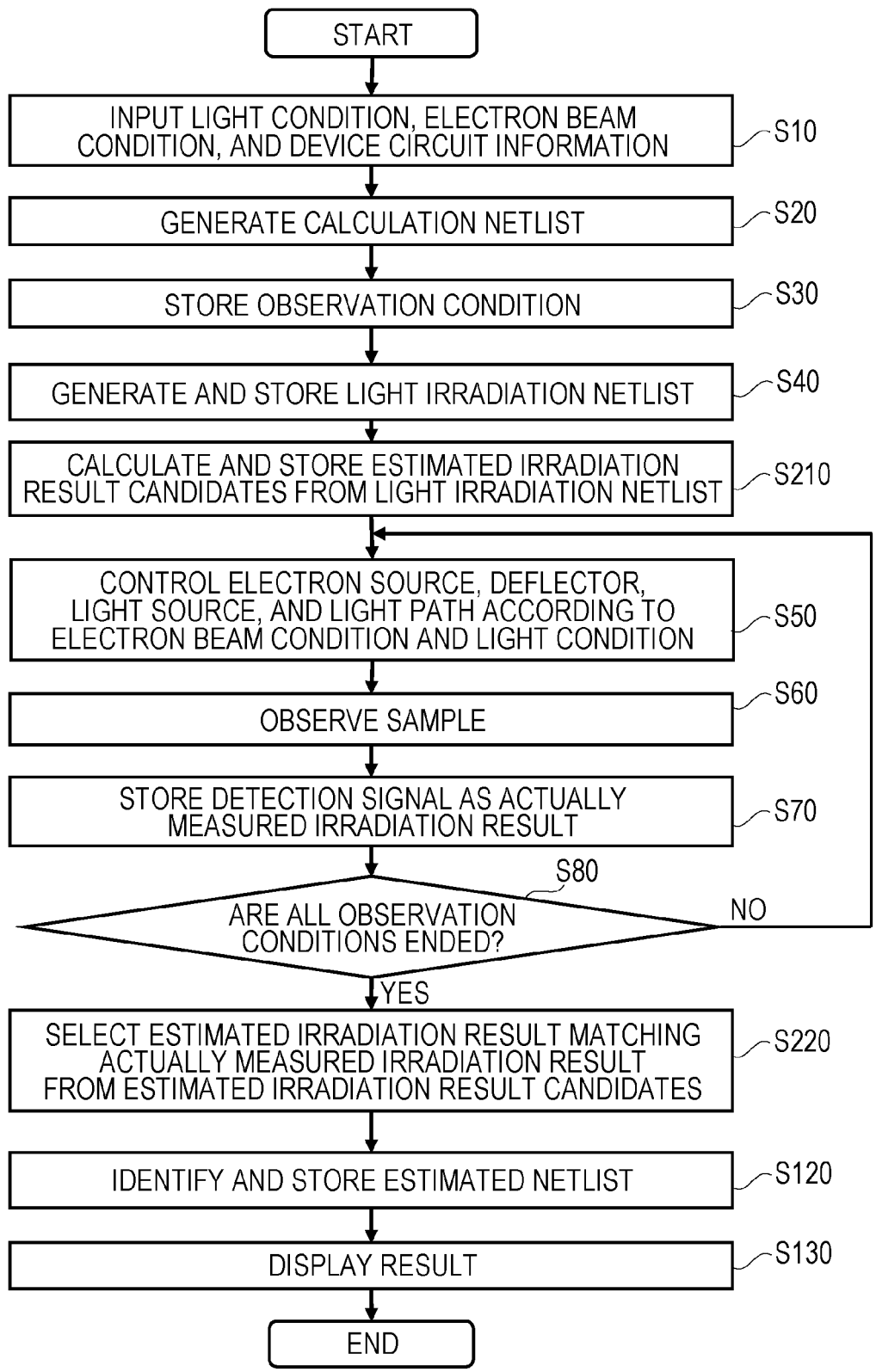
FIG. 10 is a flowchart illustrating an example of a circuit state estimation method according to a modification example.

Next, a modification example will be described. FIG. 10 is a flowchart illustrating an example of a circuit state estimation method according to the modification example. Since FIG. 10 is similar to FIG. 3, differences from FIG. 3 will be mainly described. In FIG. 10, step S210 is provided between step S40 and step S50, and step S220 is provided between step S80 and step S120. Thus, steps S90 to S110 of FIG. 3 are deleted.

In step S210, the estimated result calculator 33 estimates the plurality of irradiation results from the light irradiation netlist. For example, the estimated result calculator 33 estimates the plurality of irradiation results while changing the parameter of the light irradiation netlist. Each light irradiation netlist is stored in the light irradiation netlist storage unit 44. Each estimated irradiation result is stored in the estimated result storage unit 46.

In step S220, the estimated irradiation result matching the actually measured irradiation result is selected from the plurality of estimated irradiation results. In step S120, the light irradiation netlist corresponding to the selected estimated irradiation result is stored as an estimated netlist. The other processing is the same as that in FIG. 3.

According to this configuration, the number of times of the irradiation of the electron beam and the light irradiation is suppressed, and a time required for estimating the circuit state of the sample 23 can be shortened.

Second Embodiment

Next, a second embodiment will be described. In the present embodiment, a method of estimating the circuit state by observing a transient phenomenon will be described. In the present embodiment, at least one of the electron beam and the light is pulsed.

Figure 11A:
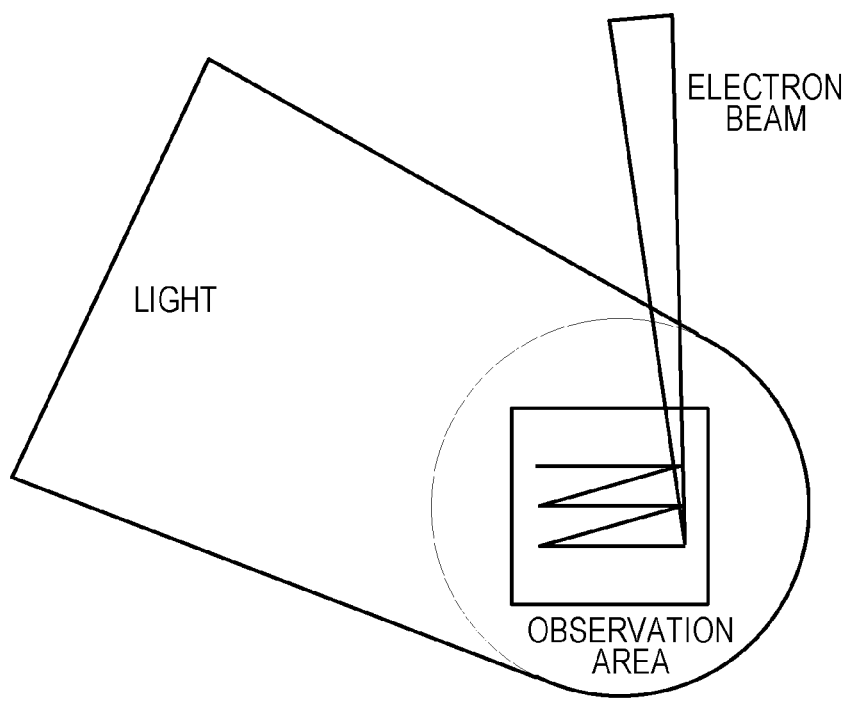

FIGS. 11A to 11D are explanatory diagrams of a circuit state estimation method according to the second embodiment of the present invention. FIG. 11A schematically illustrates a state in which an observation area of the sample is irradiated with the electron beam and the light. In FIGS. 11B, 11C, and 11D illustrate waveforms of the electron beam, the light, the detection signal, and a sampling clock, respectively.

First, FIG. 11B illustrates a case where only the electron beam is pulsed. When the electron beam is pulsed, the electron beam condition includes an electron beam pulsing condition. In this case, the detection signal is output only in a period in which the electron beam is applied. The sampling clock is set such that the detection signal can be sampled multiple times in an irradiation period of an electron beam pulse (charged particle beam pulse).

Next, FIG. 11C illustrates a case where only the light is pulsed. When the light is pulsed, the light condition includes a light pulsing condition. In this case, since the electron beam is constantly applied, the detection signal is constantly output. The intensity of the detection signal is different between a period in which the light is applied and a period in which the light is not applied. The sampling clock is set such that the detection signal can be sampled multiple times in an irradiation period of a light pulse, for example. The generation of the light pulse may be performed by switching the light source on and off, or may be performed by the light adjuster 29. In this case, the light adjuster 29 has functions of light path adjustment, polarization, and light pulse generation.

Next, FIG. 11D illustrates a case where the electron beam and the light are pulsed. For example, FIG. 11D illustrates a case where the electron beam and the light are alternately applied. In this case, the detection signal is output only in a period in which the electron beam is applied. The sampling clock is set such that the detection signal can be sampled in the irradiation period of the electron beam pulse and the irradiation period of the light pulse.

According to the present embodiment, it is possible to estimate the circuit state that requires the observation of the transient phenomenon.

Third Embodiment

Next, a third embodiment will be described. Some samples have circuits formed over a plurality of layers. There is a case where the circuit state including the electrical characteristics is desired to be estimated for each layer. Thus, in the present embodiment, a method of estimating the circuit state for each layer will be described.

Figure 12A:
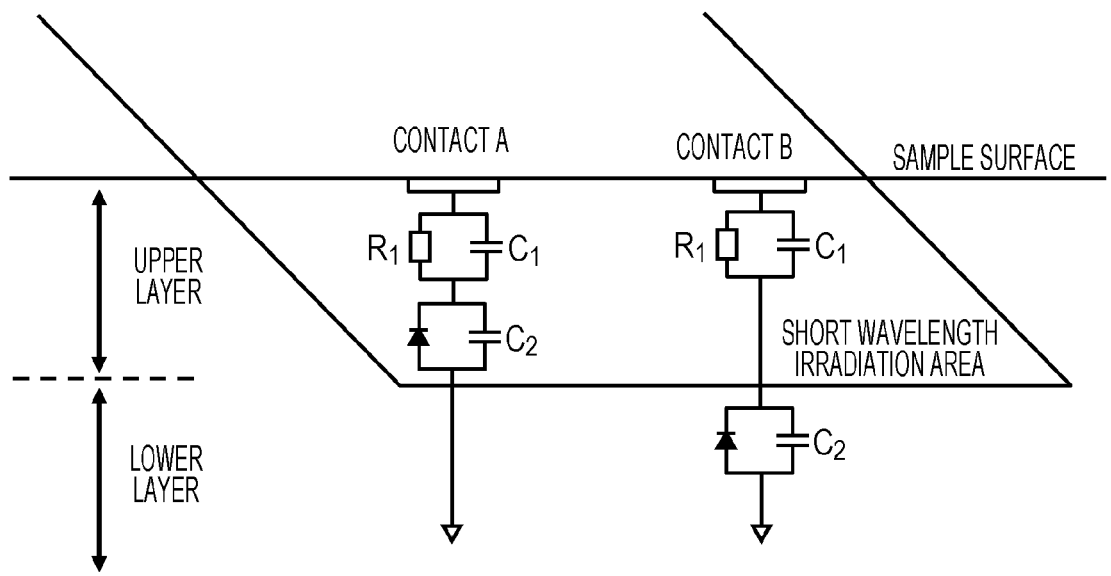
FIGS. 12A and 12B are explanatory diagrams of a circuit state estimation method according to a third embodiment of the present invention.
Figure 12B:
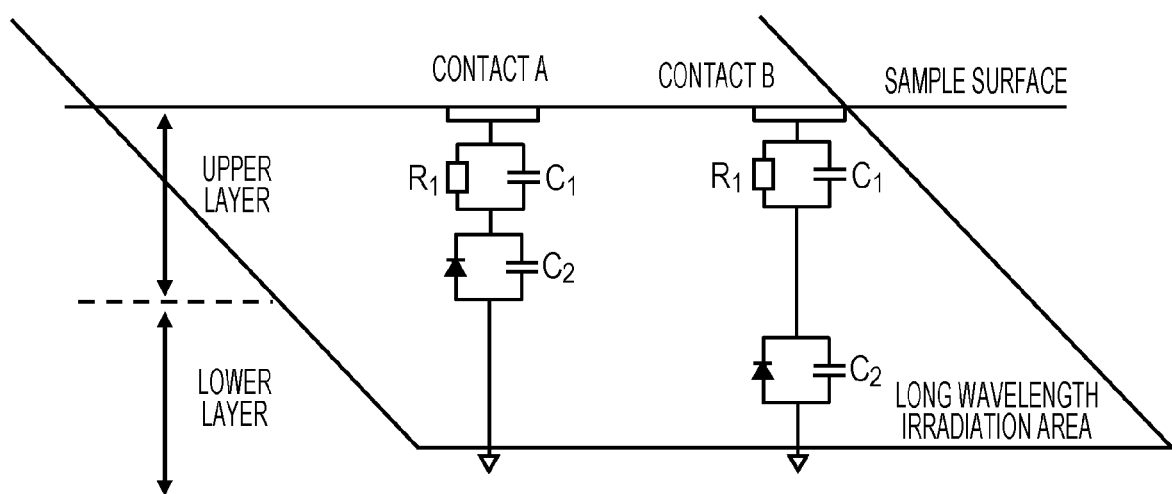
Figure 13A:
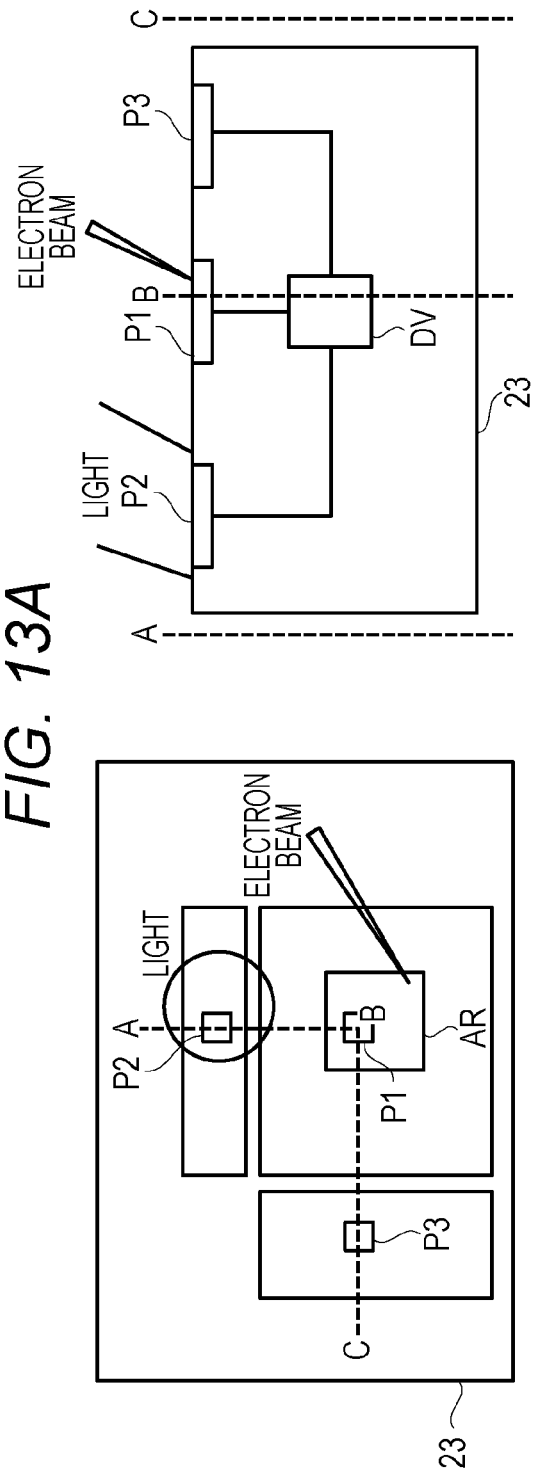
FIGS. 13A and 13B are explanatory diagrams of a circuit state estimation method according to a fourth embodiment of the present invention.
Figure 13B:
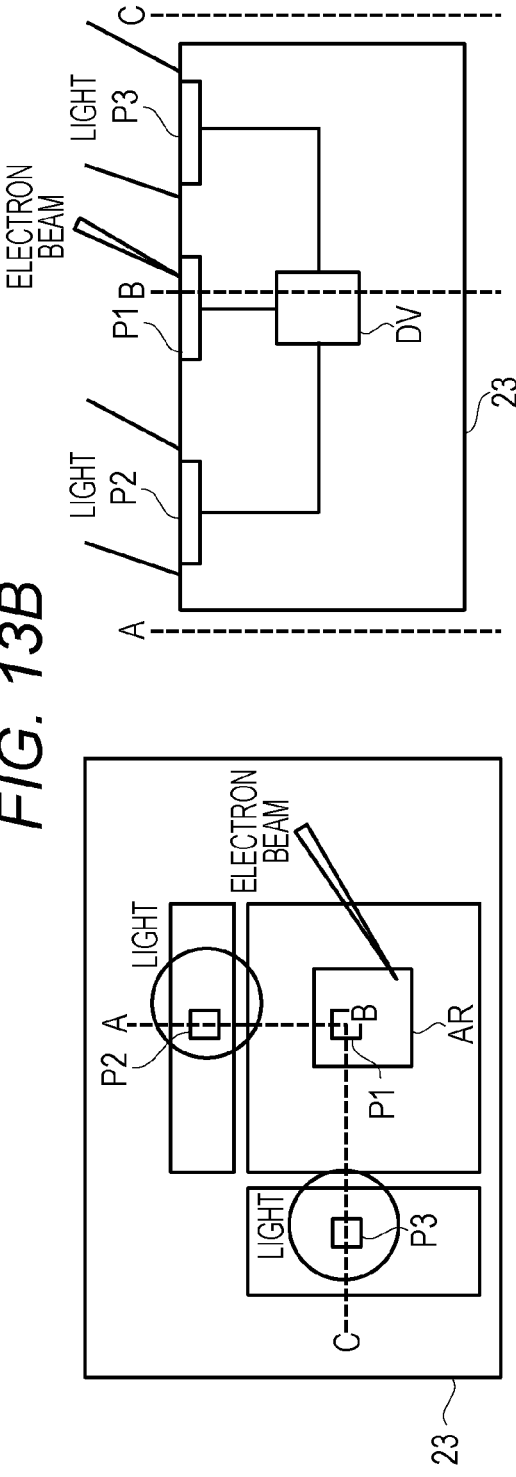

FIGS. 12A and 13B are explanatory diagrams of a circuit state estimation method according to the third embodiment of the present invention. FIGS. 12A and 12B illustrate an upper layer circuit and a lower layer circuit, respectively. Here, each circuit has the same configuration as that in FIG. 9. The circuits on the contact A side are all formed in the upper layer. Meanwhile, in the circuit on the contact B side, a parallel circuit of a capacitor C1 and a resistive element R1 directly connected to the contact B is formed in the upper layer, and a parallel circuit of a capacitor C2 and a diode is formed in the lower layer.

First, FIG. 12A is a diagram for describing a method of estimating the circuit state of the upper layer. When the circuit state of the upper layer is estimated, light having a short wavelength is applied. Accordingly, the light does not reach the lower layer, and activation of the lower circuit is suppressed.

Next, FIG. 12B is a diagram for describing a method of estimating the circuit state of the lower layer. When the circuit state of the lower layer is estimated, light having a long wavelength is applied. Accordingly, the light reaches the lower layer, and the lower circuit is activated.

As described above, in the present embodiment, the circuit state of each layer is estimated by switching the wavelength of the light. The light condition includes a wavelength condition that defines the wavelength of the light. The wavelength of the light is set according to the wavelength condition. Although it has been described in FIGS. 12A and 12B that two layers, that is, the upper layer and the lower layer are used, the present embodiment is also applicable to a structure of three or more layers.

According to the present embodiment, the circuit state is estimated for the sample 23 by using light rays having different wavelengths. According to this configuration, it is possible to estimate the circuit state for each layer.

Fourth Embodiment

Next, a fourth embodiment will be described. Although the state is measured while driving the circuit, the plug electrode for driving the circuit may not be provided in the electron beam irradiation area (charged particle beam irradiation area). For example, although the plug electrode is present in the electron beam irradiation area, when the plug electrode is an output electrode, the circuit is not activated even though the plug electrode is irradiated with the light. Thus, in the present embodiment, a countermeasure against a case where the plug electrode for activating the circuit is not provided in the electron beam irradiation area will be described.

FIGS. 13A and 13B are explanatory diagrams of a circuit state estimation method according to the fourth embodiment of the present invention. In FIGS. 13A and 13B, a plan view of the sample is illustrated on a left side, and a cross-sectional view of the sample is illustrated on a right side. An electrode P1 is provided in an electron beam irradiation area AR. Electrodes P2 and P3 are provided outside the electron beam irradiation area AR. These electrodes P1, P2, and P3 are connected to a device DV in the sample 23. However, the electrode P1 cannot activate the device DV even when the light is applied. Thus, the device DV is activated by irradiating the electrodes arranged in the area outside the electron beam irradiation area AR with the light.

For example, the calculator 31 calculates light irradiation coordinates for the electrodes for activating the device DV from the netlist and the coordinates selected in step S10 of FIG. 3. The electrodes are irradiated with the light by adding the light irradiation coordinates in the light condition.

FIG. 13A illustrates a case where the light is applied to the electrode P2. For example, when the electrode P2 is irradiated with the light, photoelectrons are excited in the electrode P2, and the electrode P2 is positively charged. When electricity is supplied from the electrode P2, the device DV is activated.

FIG. 13B illustrates a case where the light is applied to the electrodes P2 and P3. As stated above, the device DV may be activated by irradiating the plurality of electrodes with the light.

According to the present embodiment, even when there is no electrode for activating the device DV in the electron beam irradiation area AR, it is possible to activate the device DV by irradiate an area outside the electron beam irradiation area with the light. Accordingly, it is possible to estimate the circuit state.

Fifth Embodiment

Next, a fifth embodiment will be described. In the circuit state estimation processing for the sample, the actually measured irradiation result and the estimated irradiation result cannot match only by updating the light irradiation netlist. Thus, in the present embodiment, a case where the observation condition is corrected based on the comparison result between the actually measured irradiation result and the estimated irradiation result will be described.

Figure 14:
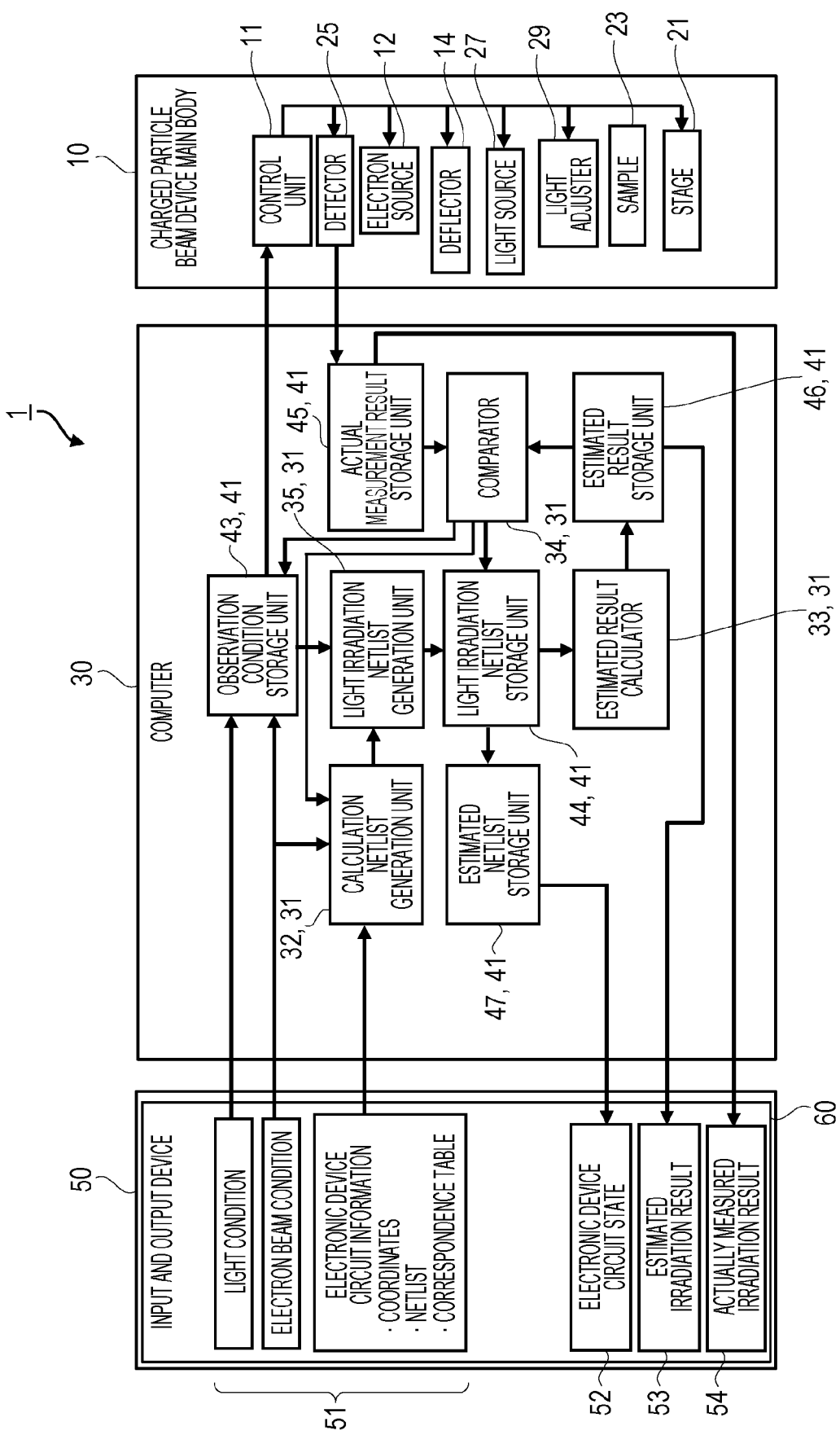
FIG. 14 is a block diagram illustrating an example of a configuration of a charged particle beam device according to a fifth embodiment of the present invention.

FIG. 14 is a block diagram illustrating an example of a configuration of the charged particle beam device according to the fifth embodiment of the present invention. FIG. 14 is similar to FIG. 2 except that the observation condition stored in the observation condition storage unit 43 can be corrected based on the comparison result.

For example, when it is determined in step S110 of FIG. 3 that the electron beam irradiation results do not match (NO), the comparator 34 corrects the observation condition in step S30. At this time, the comparator 34 may only correct only the light condition or the electron beam condition, or may correct both the light condition and the electron beam condition. In step S40, the light irradiation netlist generation unit 35 generates the light irradiation netlist again by using the corrected light condition. In step S90, the estimated result calculator 33 estimates the electron beam irradiation result again by using the corrected light irradiation netlist and the corrected electron beam condition.

The observation condition may be corrected only when a value of the comparison result, the number of times the light irradiation netlist is corrected, and an observation time exceed predetermined values.

AI such as machine learning or deep learning may be used for processing such as the correction of the observation condition.

According to the present embodiment, the observation condition can be corrected while observing the sample. According to this configuration, it is possible to more accurately match the estimated irradiation result with the actually measured irradiation result. Accordingly, it is possible to more accurately estimate the circuit state.

Sixth Embodiment

Figure 15:
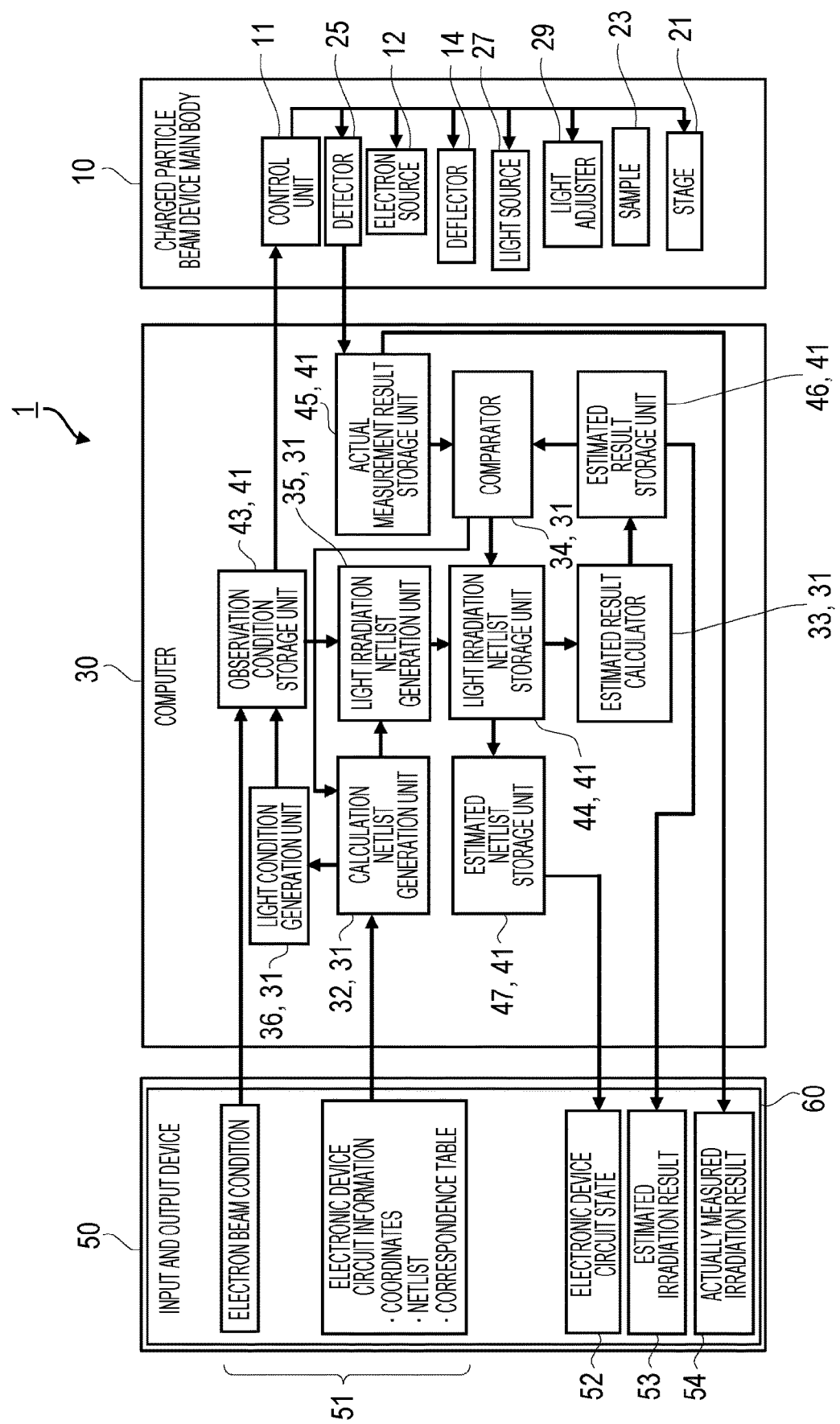
FIG. 15 is a block diagram illustrating an example of a configuration of a charged particle beam device according to a sixth embodiment of the present invention.

Next, a sixth embodiment will be described. In the present embodiment, the light condition is generated in the computer 30 based on the calculation netlist. FIG. 15 is a block diagram illustrating an example of a configuration of a charged particle beam device according to the sixth embodiment of the present invention. FIG. 15 is similar to FIG. 2 except that a light condition generation unit 36 is added.

The light condition generation unit 36 is realized by a program executed by a processor such as a CPU, for example. The light condition generation unit 36 may be constituted by, for example, an FPGA or an ASIC.

In the present embodiment, the light condition is not input in step S10 of FIG. 3. The calculation netlist generated in step S20 is also transmitted to the light condition generation unit 36. The light condition generation unit 36 generates the light condition based on the received calculation netlist. The light condition generation unit 36 detects, for example, a position of the electrode for activating the circuit from the calculation netlist, and sets the light condition such that the electrode is irradiated with the light. Alternatively, the light condition generation unit 36 generates the light condition such that a light pulse is applied by detecting an area in which the transient phenomenon is to be observed and irradiating this area with the light. The light condition generation unit 36 stores the generated light condition in the observation condition storage unit 43.

AI such as a method of machine learning or deep learning may be used for generating the light condition in the light condition generation unit 36.

According to the present embodiment, the light condition is generated in the calculator 31 of the computer 30. According to this configuration, it is possible to save time and effort in inputting and setting the light condition. Accordingly, it possible to improve operability of the device.

The present invention is not limited to the aforementioned embodiments, and includes various modification examples. Some of the components of a certain embodiment can be substituted into the components of another embodiment, and the components of another embodiment can be added to the component of a certain embodiment. In addition, the components of another embodiment can be added, removed, and substituted to, from, and into some of the components of the aforementioned embodiments. The members and relative sizes described in the drawings are simplified and idealized in order to explain the present invention in an easy-to-understand manner, and may have a more complicated shape in implementing.

What is claimed is:

1. A method comprising:
inputting a charged particle beam condition related to a charged particle beam applied in order to estimate a circuit state of a sample, a light condition related to light applied in order to estimate the circuit state of the sample, electronic device circuit information for defining a circuit of the sample, and a first irradiation result based on secondary electrons emitted from the sample by the application of the charged particle beam and the light; and performing a calculation using a computer of:
generating a calculation netlist based on the electronic device circuit information;
generating a light irradiation netlist based on the calculation netlist and the light condition;
estimating a second irradiation result when the charged particle beam and the light are applied to the sample based on the light irradiation netlist and the charged particle beam condition; and
comparing the first irradiation result with the second irradiation result by, using the computer, digitizing the first irradiation result and the second irradiation result and calculating a magnitude of a difference between the digitized first irradiation result and the digitized second irradiation result.

2. The method according to claim 1,
wherein the performing a calculation further comprises:
updating one or more of the calculation netlist and the light irradiation netlist when the first irradiation result and the second irradiation result are different; and
identifying the calculation netlist or the light irradiation netlist as a netlist that describes the circuit state of the sample when the first irradiation result and the second irradiation result match.

3. The method according to claim 2,
wherein the performing a calculation further comprises:
updating the calculation netlist or the light irradiation netlist by changing a parameter included in one or more of the calculation netlist and the light irradiation netlist.

4. The method according to claim 1,
wherein the first irradiation result includes any of a detection signal, an inspection image based on the detection signal, brightness of the inspection image, and brightness of each pixel of the inspection image.

5. The method according to claim 1,
wherein the performing a calculation further comprises:
estimating a plurality of the second irradiation results; and
selecting the second irradiation result matching the actually measured first irradiation result from the plurality of second irradiation results.

6. The method according to claim 1,
wherein the electronic device circuit information includes a netlist indicating a circuit configuration of the sample, coordinates indicating positions of plug electrodes on a surface of the sample, and a correspondence table in which the coordinates and the netlist are associated.

7. The method according to claim 6,
wherein the netlist includes a model indicating a defect of the circuit configuration.

8. The method according to claim 1,
wherein the charged particle beam condition includes a pulsing condition of the charged particle beam.

9. The method according to claim 1,
wherein the light condition includes a pulsing condition of the light.

10. The method according to claim 1,
wherein the light condition includes a wavelength condition for defining a wavelength of the light.

11. The method according to claim 1,
wherein the light is applied to an electrode in an area outside an irradiation area of the charged particle beam.

12. The method according to claim 1,
wherein, when the first irradiation result and the second irradiation result are different, the calculation corrects the charged particle beam condition and/or the light condition.

13. The method according to claim 1,
wherein the performing a calculation further comprises:
generating the light condition based on the calculation netlist.

14. A method of generating and displaying a first irradiation result and a second irradiation result,
the first irradiation result being generated using a computer based on secondary electrons emitted from a sample by a charged particle beam applied in order to estimate a circuit state of the sample and light applied in order to estimate the circuit state of the sample,
the second irradiation result being generated using the computer and estimated from a calculation netlist based on a charged particle beam condition related to the charged particle beam and electronic device circuit information for defining the circuit state of the sample, a light irradiation netlist based on the light condition related to the light, and the charged particle beam condition,
the method comprising:
generating a calculation netlist based on the electronic device circuit information;
generating a light irradiation netlist based on the calculation netlist and the light condition;
estimating a second irradiation result when the charged particle beam and the light are applied to the sample based on the light irradiation netlist and the charged particle beam condition;
comparing the first irradiation result with the second irradiation result by, using the computer, digitizing the first irradiation result and the second irradiation result and calculating a magnitude of a difference between the digitized first irradiation result and the digitized second irradiation result; and
displaying one or more of a detection signal, an inspection image based on the detection signal, brightness of the inspection image, and brightness of each pixel of the inspection image as the first irradiation result and the second irradiation result.

15. The method according to claim 14, further comprising:
displaying an estimation netlist identified from the first irradiation result and the second irradiation result.

16. The method according to claim 14, further comprising:
displaying one or more of the charged particle beam condition and the light irradiation condition.

* * * * *